(12) United States Patent
Peng et al.

(10) Patent No.: US 10,161,977 B2
(45) Date of Patent: Dec. 25, 2018

(54) CIRCUIT AND METHOD FOR GAIN MEASUREMENT

(71) Applicant: TAIWAN SEMICONDUCTOR MANUFACTURING COMPANY, LTD., Hsinchu (TW)

(72) Inventors: Yung-Chow Peng, Hsinchu (TW); Brady Yang, Hsinchu (TW); Wen-Shen Chou, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 634 days.

(21) Appl. No.: 14/482,168

(22) Filed: Sep. 10, 2014

(65) Prior Publication Data

US 2015/0362540 A1    Dec. 17, 2015

Related U.S. Application Data

(60) Provisional application No. 62/011,310, filed on Jun. 12, 2014.

(51) Int. Cl.
*G01R 27/28* (2006.01)
*H03F 3/45* (2006.01)
*H03G 3/00* (2006.01)

(52) U.S. Cl.
CPC ......... *G01R 27/28* (2013.01); *H03F 3/45475* (2013.01); *H03F 2203/45138* (2013.01); *H03F 2203/45528* (2013.01); *H03G 3/00* (2013.01)

(58) Field of Classification Search
USPC ......... 324/616, 750.01, 750.3; 330/254, 278, 330/69, 261, 127, 136, 2, 295, 296, 310
See application file for complete search history.

(56) References Cited

U.S. PATENT DOCUMENTS

| | | | | |
|---|---|---|---|---|
| 3,623,140 A | * | 11/1971 | Nercessian | G05F 1/595 323/268 |
| 6,081,157 A | * | 6/2000 | Ikeda | H03H 11/1217 330/107 |
| 2006/0103462 A1 | * | 5/2006 | Capofreddi | H03F 1/0205 330/86 |
| 2008/0272950 A1 | * | 11/2008 | Eastty | H03M 1/187 341/157 |
| 2009/0009240 A1 | * | 1/2009 | Takemoto | H03F 1/26 330/9 |
| 2010/0007419 A1 | * | 1/2010 | Gilbert | H03F 1/302 330/254 |
| 2012/0119930 A1 | * | 5/2012 | Kumar | H03F 3/45475 341/118 |
| 2013/0162240 A1 | * | 6/2013 | Nielsen | H03F 3/45475 324/71.1 |

* cited by examiner

*Primary Examiner* — Melissa Koval
*Assistant Examiner* — Nasima Monsur
(74) *Attorney, Agent, or Firm* — Hauptman Ham, LLP

(57) ABSTRACT

A circuit for measuring a gain of an amplifier includes a first node coupled to an output of the amplifier, a second node, a first circuit coupled to an input and the output of the amplifier, and a second circuit coupled between the first circuit and the second node. The first circuit is configured to cause a first gain drop in a gain to be measured between the first node and the second node. The second circuit configured to cause a second gain drop in the gain to be measured between the first node and the second node.

20 Claims, 5 Drawing Sheets

CIRCUIT AND METHOD FOR GAIN MEASUREMENT

PRIORITY CLAIM

The instant application is a non-provisional application claiming the benefit of Provisional Application No. 62/011,310, filed Jun. 12, 2014. The entire content of Provisional Application No. 62/011,310 is incorporated by reference herein.

CROSS-REFERENCE

The instant application is related to Provisional Application No. 62/011,295, filed Jun. 12, 2014. The entire content of Provisional Application No. 62/011,295 is incorporated by reference herein.

The instant application is also related to a non-provisional application claiming the benefit of Provisional Application No. 62/011,295, entitled "CIRCUIT AND METHOD FOR BANDWIDTH MEASUREMENT,". The entire content of the non-provisional application claiming the benefit of Provisional Application No. 62/011,295, entitled "CIRCUIT AND METHOD FOR BANDWIDTH MEASUREMENT," is incorporated by reference herein.

BACKGROUND

Amplifiers, such as operational amplifiers, are used in various types of circuits. Among various parameters of an amplifier, gain is a design consideration for not only the amplifier but also other components in a circuit using the amplifier. Amplifier gain measurements are performed to obtain data useful for design and/or manufacture and/or operation improvements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
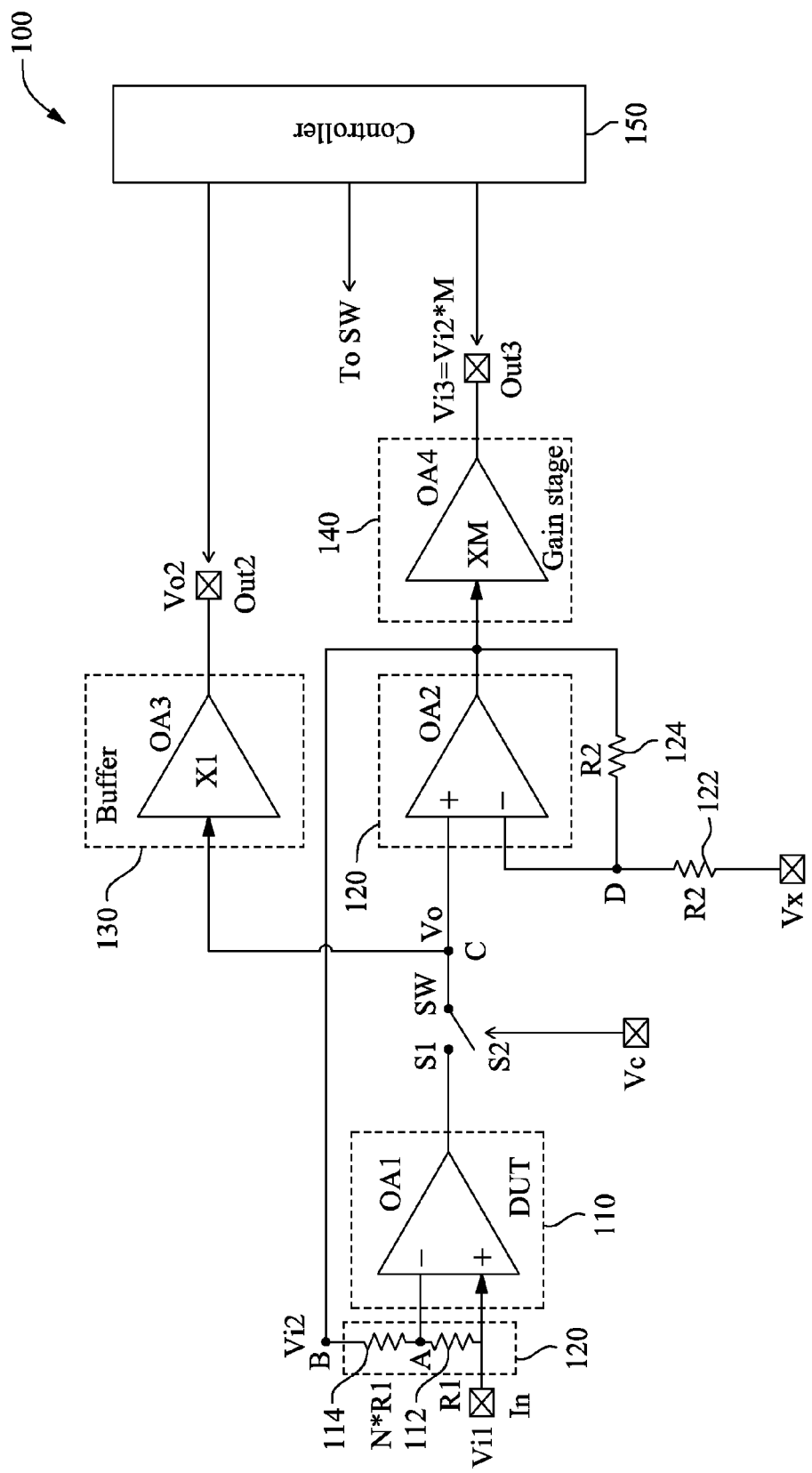
FIG. 1A is a schematic circuit diagram of a gain measurement circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

FIG. 1A is a schematic circuit diagram of a gain measurement circuit 100 in accordance with some embodiments. The gain measurement circuit 100 comprises an input In, outputs Out2 and Out3 (also referred to herein as nodes), a switch SW, a device under test (DUT) 110, an attenuating circuit 120, a buffer 130, a gain stage 140 and a controller 150.

The DUT 110 comprises a circuit having a gain to be measured. In the example configuration illustrated in FIG. 1A, the DUT 110 comprises an operational amplifier OA1. In at least one embodiment, the DUT 110 comprises an operational trans-conductance amplifier (OTA). Other configurations of the DUT 110 are within the scope of various embodiments. In the following description, the DUT 110 comprises the operational amplifier OA1. The operational amplifier OA1 comprises a non-inverting input coupled to the input In, an inverting input coupled to a node A, and an output.

The switch SW is configured to switch the gain measurement circuit 100 between a measurement mode and a calibration as described herein. The switch SW has a first terminal S1 coupled to the output of the operational amplifier OA1, a second terminal S2 coupled to a voltage node Vc, a third terminal coupled to a node C, and a control terminal (not indicated in FIG. 1A). The switch SW is configured to, in accordance with a control signal at the control terminal, couple either the output of the operational amplifier OA1 to the node C, or to couple the voltage node Vc to the node C. In at least one embodiment, the controller 150 is configured to output the control signal to the control terminal of the switch SW. In at least one embodiment, the switch SW comprises a three-way switch having a first position coupling the first terminal S1 and the output of the operational amplifier OA1 to the node C, and a second position coupling the second terminal S2 and the voltage node Vc to the node C. In at least one embodiment, the switch SW comprises two transistors configured to controllably couple the node C to the corresponding first terminal S1 and second terminal S2. Other switching arrangements of the switch SW are within the scope of various embodiments.

The attenuating circuit 120 is configured to attenuate the gain measured at the output Out2 and the output Out3 as described herein. In the example configuration illustrated in FIG. 1A, the attenuating circuit 120 comprises an operational amplifier OA2, and resistors 112, 114. The operational amplifier OA2 comprises a non-inverting input coupled to the node C, an inverting input coupled via a node D to a voltage node Vx, and an output coupled to a node B. The resistor 112 (also referred to herein as resistor R1) is coupled between the non-inverting input and the inverting input of the operational amplifier OA1. The resistor 114 (also referred to herein as resistor N*R1) has a resistance N times greater than that of the resistor R1, and is coupled between the node A and the node B. The ratio N of the resistances of the resistor 114 to the resistor 112 defines an attenuation factor of the attenuating circuit 120. A resistor 122 having a resistance R2 is coupled between the inverting input of the operational amplifier OA2 and a voltage node Vx. A resistor 124 having a resistance R2 is coupled between the inverting input of the operational amplifier OA2 and the output of the operational amplifier OA2. Other configurations of the attenuating circuit 120 are within the scope of various embodiments.

The buffer 130 is configured for blocking or restricting noises from being introduced into the gain measurement circuit 100 from a tester, such as a prober, via the output Out2. In the example configuration illustrated in FIG. 1A, the buffer 130 comprises an operational amplifier OA3. The buffer 130 comprises an input coupled to the node C, and an output coupled to the output Out2. In at least one embodiment, the buffer 130 is a uni-gain buffer, having a gain of 1. An example configuration of the buffer 130 is described with respect to FIG. 3. Other configurations of the buffer 130 are within the scope of various embodiments. In some embodiments, the buffer 130 is omitted. For example, in at least one embodiment, the controller 150 is configured on the same chip as the other components of the gain measurement circuit 100 (also referred to herein as an on-chip configuration) and is connected to the output Out2 via a conductive track instead of a prober. As a result, a likelihood of noises being introduced into the gain measurement circuit 100 via the output Out2 is lower, and the buffer 130 is omitted. In at least one embodiment, the buffer 130 is included in the gain measurement circuit 100 in the on-chip configuration.

The gain stage 140 is configured to increase a level of a signal Vi2 outputted by the attenuating circuit 120. In the example configuration illustrated in FIG. 1A, the gain stage 140 comprises an operational amplifier OA4. The gain stage 140 comprises an input coupled to the output of the operational amplifier OA2, and an output coupled to the output Out3. The gain stage 140 has a gain factor of M. An example configuration of the gain stage 140 is described with respect to FIG. 3. Other configurations of the gain stage 140 are within the scope of various embodiments. In at least one embodiment, the gain stage 140 blocks or restricts noises from being introduced into the gain measurement circuit 100 from a tester, such as a prober, via the output Out3, similar to the buffer 130. As a result, a separate buffer is not arranged between the gain stage 140 and the output Out3 in at least one embodiment.

The controller 150 has inputs coupled to the corresponding outputs Out2 and Out3, and is configured to process measurement signals Vo2 and Vi3 outputted from the corresponding outputs Out2 and Out3. In at least one embodiment, the controller 150 is configured to process the measurement signals Vo2 and Vi3, and the control signal for the switch SW is generated by external circuitry. In at least one embodiment, the controller 150 is an external circuit that is not considered as a part of the gain measurement circuit 100. In at least one embodiment, the controller 150 comprises a tester having probe pins contactable with the outputs Out2 and Out3 to receive the corresponding measurement signals Vo2 and Vi3. For example, this configuration is implemented for WAT (wafer acceptance) tests in one or more embodiments. In at least one embodiment, the controller 150 is implemented on the same die or chip as the gain measurement circuit 100 (i.e., in an on-chip configuration), and is coupled to the outputs Out2 and Out3 via conductive traces, vias, bumps and/or other interconnection features. This on-chip configuration is implemented for on-chip measurement and/or auto-optimization in one or more embodiments. In at least one embodiment, the controller 150 comprises one or more of a processor, a central processing unit (CPU), a multi-processor, a distributed processing system, an application specific integrated circuit (ASIC), and a suitable processing unit.

Figure 1B:
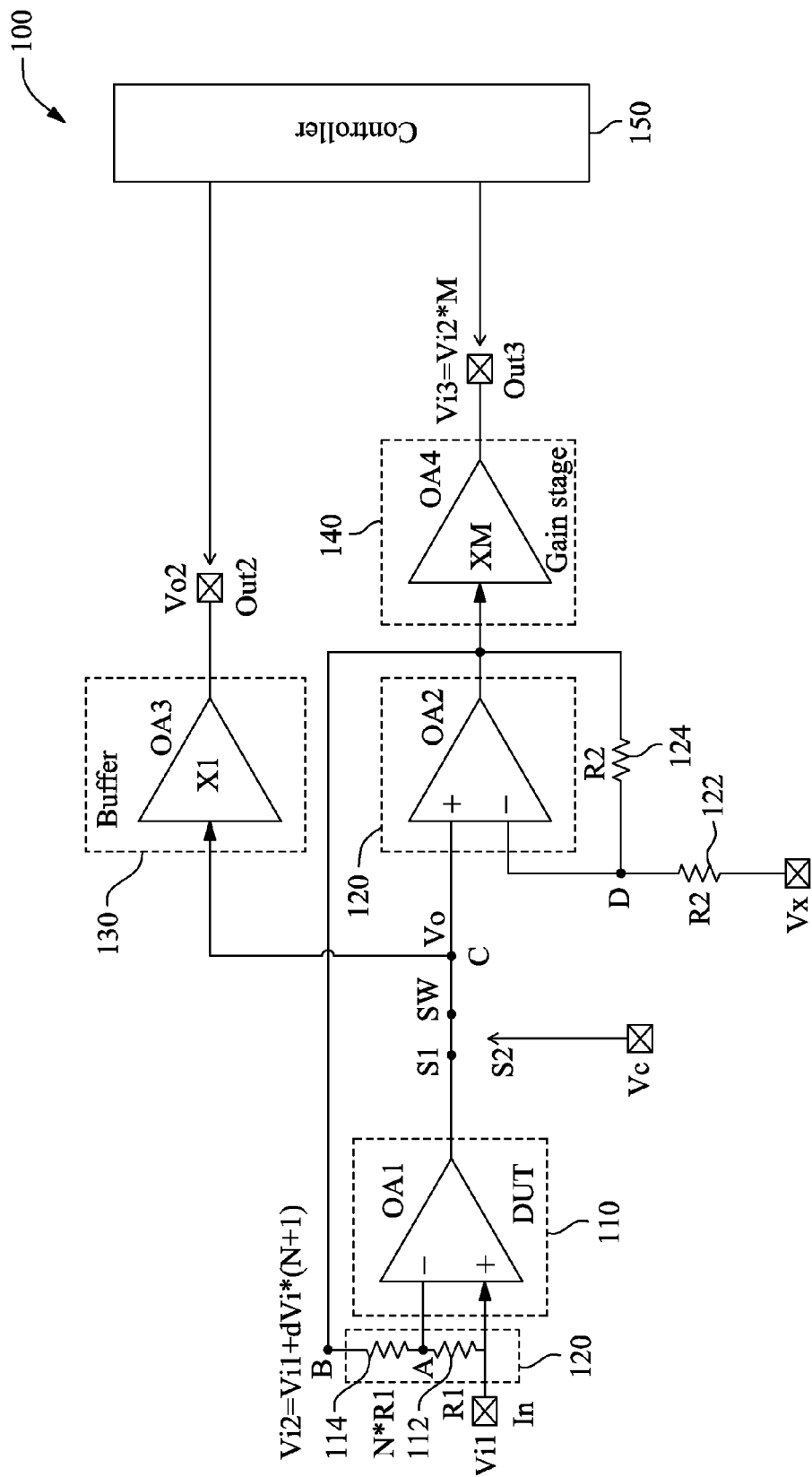
FIG. 1B is a schematic diagram of the gain measurement circuit of FIG. 1A in a measurement mode, in accordance with some embodiments.

FIG. 1B is a schematic diagram of the gain measurement circuit 100 of FIG. 1A in a measurement mode, in accordance with some embodiments. In at least one embodiment, the measurement mode is a direct-current (DC) mode. In the measurement mode, the switch SW connects the non-inverting input of the operational amplifier OA2 to the output of the operational amplifier OA1, and disconnects the non-inverting input of the operational amplifier OA2 from the voltage node Vc. An input voltage Vi1 is supplied to the input In the measurement mode. A voltage Vi2 at the node B is determined by the following equation:

$$Vi2 = Vi1 + dVi*(N+1) \tag{1}$$

where dVi is a voltage difference between the inverting input and the non-inverting input of the operational amplifier OA1.

The voltage Vi2 at the node B is the voltage at the output of the operational amplifier OA2 and is also the voltage at the input of the operational amplifier OA4 of the gain stage 140. The gain stage 140 amplifies the voltage Vi2 by the gain factor M of the gain stage 140 to obtain the Vi3 at the output Out3, as described by the following equation:

$$Vi3 = Vi2*M \tag{2}$$

The operational amplifier OA1 outputs a voltage Vo at the output of the operational amplifier OA1 in response to the input voltage Vi1. The voltage Vo reflects the gain to be measured of the operational amplifier OA1. The voltage Vo2 at the output Out2 follows the voltage Vo, and also reflects the gain to be measured. The voltage Vi3 at the output Out3 reflects the input voltage Vi1. The voltages Vo2 and Vi3 are measurement signals monitored by the controller 150. A relationship between the measurement signals Vo2 and Vi3 and the gain to be measured is described by the following equations:

$$\text{Measured Gain} = \frac{dVo2}{dVi3} = \frac{dVo}{(dVi*(N+1)*M)} \tag{3}$$
$$= DUT\ \text{Gain} - 20*\log(N+1)\text{dB} - 20*\log(M)\text{dB}$$

or $$DUT\ \text{Gain} = \text{Measured Gain} + 20*\log(N+1)\text{dB} + 20*\log(M)\text{dB} \tag{4}$$

where Measured Gain is the gain determined by the controller 150 based on measured values of the voltages Vo2 and Vi3 in the measurement mode, DUT Gain is the gain to be measured of the DUT 110, 20*log(N+1) dB is a gain drop (in decibel) introduced by the attenuating circuit 120, and 20*log(M) dB is a gain drop (in decibel) introduced by the gain stage 140. By measuring the measurement signals Vo2 and Vi3 and using the values N and M already known at the design stage of the gain measurement circuit 100, the gain of the DUT 110 is obtainable from the equation (4).

In some embodiments, by selecting the factors N and/or M, measurement limits of a tester is expandable for measurements of DUTs having higher gains than the measurement limits of a tester. For example, in at least one embodiment, the tester, such as the controller 150, is configured to measure gains up to 60 dB. To measure a DUT having a gain higher than 60 dB, e.g., about 70 dB, N is selected to be 9 and M is selected to be 1 in one or more embodiments. The gain drop 20*log(N+1) dB introduced by the attenuating circuit 120 is 20 dB, and permits the DUT Gain of up to 80 dB to be measured by the tester having a measurement capability of up to 60 dB. The higher the N value, the greater the gain drop introduced by the attenuating circuit 120, and the higher the measurable range of gain provided by the gain measurement circuit 100. As a result, high gain measurements are achievable in one or more embodiments.

In some situations, a high value of N potentially causes instability in the circuit operation. In at least one embodiment, N is selected to be 20 or less to ensure circuit stability. To ensure that an intended measurable range of gain is achievable while avoiding the possibility of circuit instability, N is selected to be in a range where circuit instability is unlikely, and M is selected to provide the intended expansion of the measurable range of gain. In an example embodiment, N is selected to be 9 and M is selected to be 10. As a result, the gain drop 20*log(N+1) dB introduced by the attenuating circuit 120 and the gain drop 20*log(M) introduced by the gain stage 140 are both 20 dB, which permit a tester having a measurement limit of 60 dB to measure gains of up to 100 dB. Increasing the value of M in one or more embodiments also increases the resolution of the gain measurement. In at least one embodiment, the gain resolution of 1 dB or better is achievable in the gain measurement circuit 100. In at least one embodiment, the upper limit of M is defined by the die area allocated to the gain measurement circuit 100, because the higher the M value, the larger the gain stage 140 and the gain measurement circuit 100.

In some embodiments, the selection of M involves a consideration of a measurable voltage level. For example, in at least one embodiment, the tester, such as the controller 150, is configured to detect voltages at or higher than a minimum detectable level, such as 0.3 mV. In some situations when the operational amplifier OA1 is a high gain amplifier, the voltage Vi2 is potentially lower than the minimum detectable level. By selecting an appropriate value of M, the low level of the voltage Vi2, which would be otherwise not detectable by the tester, is amplified M times by the gain stage 140 to the voltage Vi3 having a level sufficient to be detectable by the tester. As a result, a tester configured for testing amplifiers of lower gains is usable in one or more embodiments for testing amplifiers of higher gain.

In at least one embodiment, the voltage Vx is selected to adjust the voltage level of the measurement signal Vi3 to be at or higher than the minimum detectable level of the tester. For example, in some situations where the factor M is limited by the die area allocated to the gain measurement circuit 100 and/or by other design consideration and the factor M is potentially insufficient to ensure a minimum detectable level of the Vi3, the voltage Vx is selected in at least one embodiment to be higher than the ground voltage to boost the voltage Vi3 to at least the minimum detectable level of the tester. The voltage Vx, in some embodiments, is a common mode voltage. In at least one embodiment, the voltage Vx is the ground voltage.

The DUT Gain determined by the equation (4) includes variations caused by the remaining components of the gain measurement circuit 100 other than the DUT 110. In some embodiments, such variations are tolerable and the DUT Gain determined by equation (4) is considered to be a sufficiently accurate value of the gain of the DUT 110. In some embodiments, such variations effect the measurement accuracy, and are compensated for by additionally performing measurements in a calibration mode.

Figure 1C:
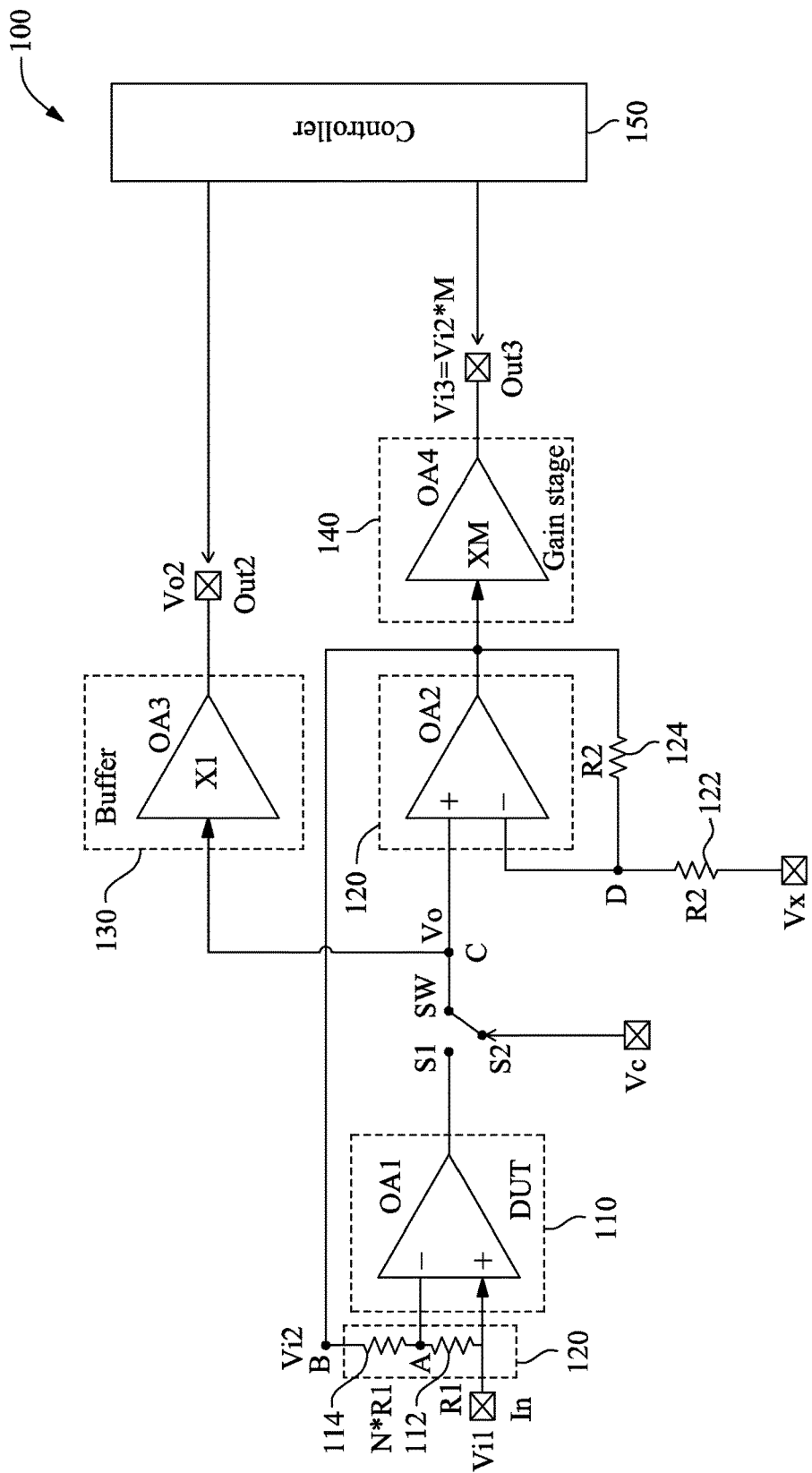
FIG. 1C is a schematic diagram of the gain measurement circuit of FIG. 1A in a calibration mode, in accordance with some embodiments.

FIG. 1C is a schematic diagram of the gain measurement circuit 100 of FIG. 1A in a calibration mode, in accordance with some embodiments. In the calibration mode, the switch SW connects the non-inverting input of the operational amplifier OA2 to the voltage Vc, and disconnects the non-inverting input of the operational amplifier OA2 from the DUT 110. The DUT 110 is effectively powered off. The voltage Vc, in some embodiments, is a common mode voltage. In at least one embodiment, the voltage Vc is equal to the voltage Vx. In at least one embodiment, the input voltage Vi1 in the calibration mode is the ground voltage. The measurement signals Vo2 and Vi3 in the calibration mode reflect the variations caused by the remaining components of the gain measurement circuit 100, as described in the following equation:

$$\text{Calibrated Gain} = dVo2/dVi3 \tag{5}$$

where Calibrated Gain is the gain determined by the controller 150 based on measured values of the voltages Vo2 and Vi3 in the calibration mode, and corresponds to the variations caused by the components of the gain measurement circuit 100 other than the DUT 110.

Based on the measurements of the measurement mode and the calibration mode, the gain of the DUT 110 is determined with calibration by the following equations:

$$\text{Measured Gain with Calibration} = \left(\frac{dVo2}{dVi3} \text{ in the measurement mode}\right) - \left(\frac{dVo2}{dVi3} \text{ in the calibration mode}\right) \tag{6}$$
$$= \text{Measured Gain} - \text{Calibrated Gain}$$
$$= DUT \text{ Gain} - 20*\log(N+1)\text{dB} - 20*\log(M)\text{dB}$$

or $$DUT \text{ Gain} = \text{Measured Gain} + 20*\log(N+1)\text{dB} + 20*\log(M)\text{dB} - \text{Calibrated Gain} \tag{7}$$

By obtaining gain measurements in the measurement mode and the calibration mode, and subtracting one measured gain from the other in accordance with some embodiments, the variations caused by the remaining components of the gain measurement circuit 100 other than the DUT 110 is compensated for, and a more accurate value of the gain of the DUT 110 is obtainable in at least one embodiment.

Figure 2A:
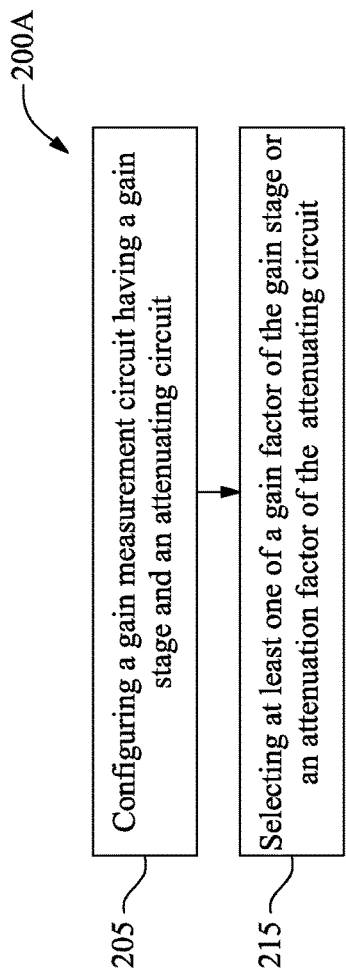
FIG. 2A is a flow chart of a method of configuring a gain measurement circuit, in accordance with some embodiments.

FIG. 2A is a flow chart of a method 200A of configuring a gain measurement circuit, in accordance with some embodiments. In at least one embodiment, the method 200A is performed for configuring the gain measurement circuit 100 described herein. In at least one embodiment, the method 200A is performed at least in part by at least one of a processor, a central processing unit (CPU), a multi-processor, a distributed processing system, an application specific integrated circuit (ASIC), or a suitable processing unit.

In operation 205 of the method 200A, a gain measurement circuit for measuring a gain of a DUT is configured to include a gain stage and an attenuating circuit. For example, a gain stage 140 and an attenuating circuit 120 are included in the gain measurement circuit 100 for measuring the gain of the DUT 110, as described herein with respect to FIG. 1A. In at least one embodiment, the gain measurement circuit is further configured to comprise a buffer, such as the buffer 130 as described herein.

In operation 215 of the method 200A, a gain factor of the gain stage and/or an attenuation factor of the attenuating circuit are selected. For example, the gain factor M of the gain stage 140 and/or the attenuation factor N of the attenuating circuit 120 are selected based one or more considerations including, but not limited to, circuit stability, resolution, intended measurable range of gain, testability of small signals and the like considerations.

After the design state performed in the method 200A, the gain measurement circuit, including the DUT, is manufactured on a die or chip. The manufactured gain measurement circuit is then operated to measure the gain of the DUT in a testing stage. In some embodiments, the testing stage is performed before packaging the chip or die. As result, manufacturing and/or testing time is saved.

Figure 2B:
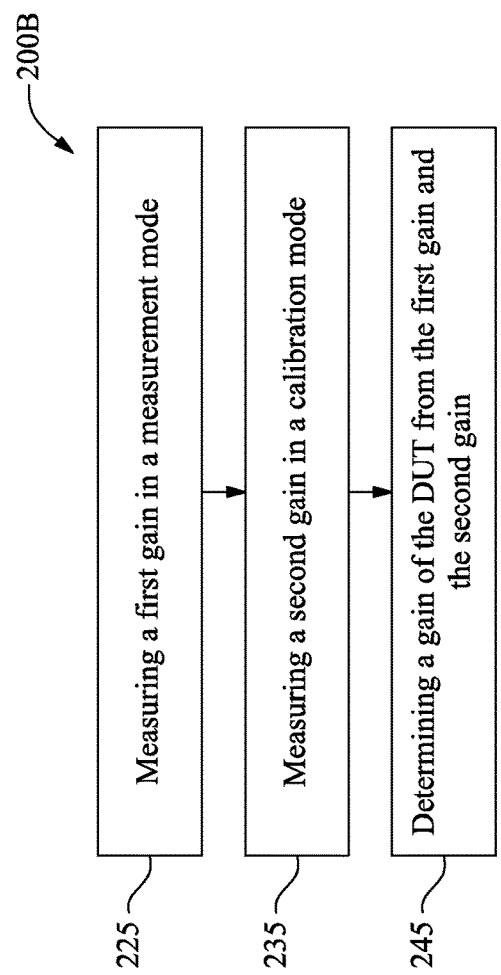
FIG. 2B is a flow chart of a method of operating a gain measurement circuit, in accordance with some embodiments.

FIG. 2B is a flow chart of a method 200B of operating a gain measurement circuit, in accordance with some embodiments. In at least one embodiment, the method 200B is performed for operating the gain measurement circuit configured in the design stage described with respect to FIG. 2A.

In operation 225 of the method 200B, measurement signals are obtained in a measurement mode. For example, as described with respect to FIG. 1B, the switch SW connects the output of the DUT 110 to the attenuating circuit 120, and the voltages Vo2 and Vi3 are measured in a DC mode. Based on the measured voltages, the Measured Gain in the measurement mode is obtained. The Measure Gain includes the gain of the DUT 110 (i.e., DUT Gain), minus a first gain drop caused by the attenuating circuit 120 (i.e., 20*log(N+1) dB), minus a second gain drop caused by the gain stage 140 (i.e., 20*log(M) dB), and plus the variations caused by the components of the gain measurement circuit 100 other than the DUT 110.

In operation 235 of the method 200B, measurement signals are obtained in a calibration mode. For example, as described with respect to FIG. 1C, the switch SW disconnects the output of the DUT 110 from the attenuating circuit 120, and connects the attenuating circuit 120 to a reference voltage Vc. Based on the measured voltages, the Calibrated Gain in the calibration mode is obtained. The Calibrated Gain includes the variations caused by the components of the gain measurement circuit 100 other than the DUT 110.

In operation 245 of the method 200B, the gain of the DUT is determined by cancelling the gain measured in the calibration mode from the gain measured in the measurement mode. For example, as described with respect to FIG. 1C, the variations caused by the components of the gain measurement circuit 100 other than the DUT 110 and obtained in the calibration mode (i.e., the Calibrated Gain) are subtracted from the Measured Gain obtained in the measurement mode, and the first and second gain drops are added to the subtraction result. As a result the DUT Gain of the DUT 110 is determined based on the equation (7). The cancellation of the variations caused by the components of the gain measurement circuit 100 other than the DUT 110 from the gain measured in the measurement mode improves the gain measurement accuracy in at least one embodiment.

The determined gain of the DUT is used in various manners, depending on the applications. In at least one embodiment, the determined gain of the DUT is fed back to the designer of the chip for chip design improvements and/or optimization and/or revision. In at least one embodiment, the determined gain of the DUT is used to improve the accuracy of the device model used for designing the chip or subsequent chips. In at least one embodiment, the determined gain of the DUT is used by a controller on the same chip for bias auto-adjusting optimization of functional devices on the same chip which have configurations identical to, or based on, the configuration of the DUT. As a result, in one or more embodiments, the operation of the functional devices on the chip is optimized after the manufacture by using the described on-chip configuration.

Figure 3:
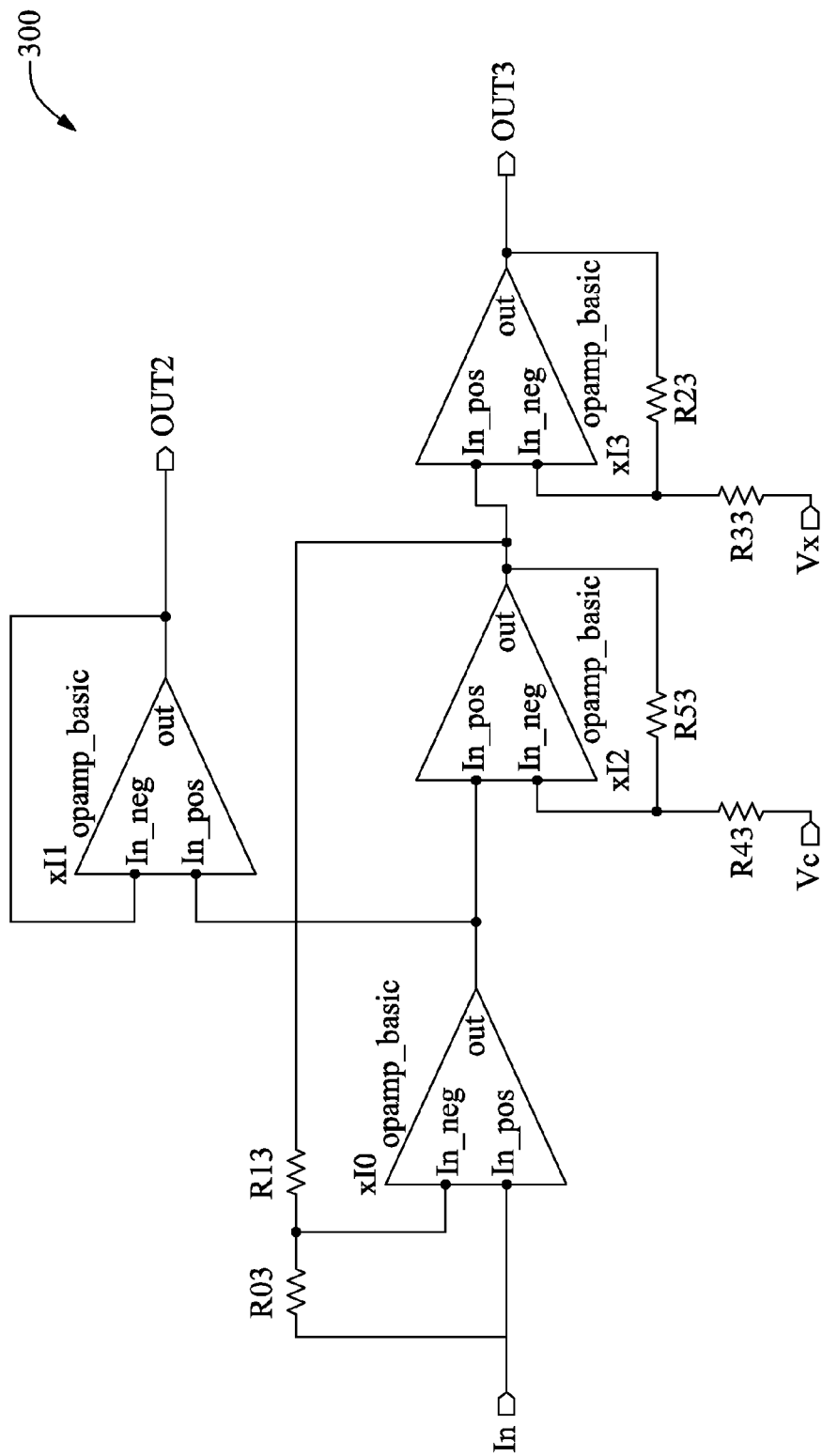
FIG. 3 is a schematic circuit diagram of a gain measurement circuit in a measurement mode, in accordance with some embodiments.

FIG. 3 is a schematic circuit diagram of a gain measurement circuit 300 in a measurement mode, in accordance with some embodiments. The gain measurement circuit 300 comprises operational amplifiers X10, X11, X12 and X13 corresponding to operational amplifiers OA1, OA3, OA2 and OA4 in the gain measurement circuit 100. The operational amplifier X11 has an inverting input and an output coupled to each other, and defines a uni-gain buffer corresponding to the buffer 130. The operational amplifier X10 has an inverting input coupled to resistors R03 and R13 corresponding to resistors R1 and R2 described with respect to FIG. 1A. The resistance of the resistor R13 is 10 times of that of the resistor R03. The attenuation factor N in the gain measurement circuit 300 is 10. The operational amplifier X13 has an inverting input and an output coupled to each other via a resistor R23. The inverting input of the operational amplifier X13 is further coupled via a resistor R33 to a reference voltage Vx. The resistance of the resistor R23 is 10 times of that of the resistor R33. The gain factor M in the gain measurement circuit 300 is 10. The operational amplifier X12 has an inverting input and an output coupled to each other via a resistor R53. The inverting input of the operational amplifier X12 is further coupled via a resistor R43 to a reference voltage Vc. The resistance of the resistor R43 is equal to that of the resistor R53. The described values for various resistors and/or attenuation factor N and/or gain factor M are examples. Other arrangements are within the scope of various embodiments. The operation of the gain measurement circuit 300 in accordance with some embodiments is similar to that of the gain measurement circuit 100.

Embodiments that combine different features and/or different embodiments are within the scope of the disclosure and will be apparent to those of ordinary skill in the art after reviewing various embodiments.

In some embodiments, high gain measurements are achievable. In at least one embodiment, the gain measurement circuit is configured to measure amplifier gains of at least 60 dB. In at least one embodiment, the gain of the DUT is measured directly, without dividing the DUT into sub-components and performing separate measurements for the sub-components as in other approaches. As a result, measurement speed is improved in at least one embodiment. In some embodiments, resolution, stability and/or testability of small signal levels (e.g., at 0.3 mV or lower) is/are further improved by selecting appropriate values for the attenuation factor N and/or gain factor M. In some embodiments, the gain measurement circuit is suitable for wafer measurement testing (WAT testing). In one or more embodiments, the obtained measurement results are quick and accurate, and permit improvement of device models used for designing the same chip or subsequent chips. In some embodiments, the gain measurement circuit is implemented for on-chip measurement. The measured signals from the on-chip gain measurement circuit is used as feedback to a controller for bias auto-adjusting optimization of other functional circuitry on the chip. The gain measurement circuit in some embodiments is suitable for advanced process nodes.

In some embodiments, a gain stage is included in a gain measurement circuit in addition to an attenuating circuit for improving resolution and/or circuit stability. In at least one embodiment, a buffer is included in the gain measurement circuit for noise blocking or restriction.

In some embodiments, a circuit for measuring a gain of an amplifier comprises a first node coupled to an output of the amplifier, a second node, a first circuit coupled to an input and the output of the amplifier, and a second circuit coupled between the first circuit and the second node. The first circuit is configured to cause a first gain drop in a gain to be measured between the first node and the second node. The second circuit configured to cause a second gain drop in the gain to be measured between the first node and the second node.

In some embodiments, a gain measurement circuit comprises a first amplifier, a second amplifier, a gain stage, a first resistor and a second resistor. The first amplifier has a gain to be measured. The first amplifier has a first input, a second input, and an output coupled to a first node. The second amplifier has a first input coupled to the output of the first amplifier, a second input, and an output. The gain stage has an input coupled to the output of the second amplifier, and an output coupled to a second node. The first resistor is coupled between the first input and the second input of the first amplifier. The second resistor is coupled between the second input of the first amplifier and the output of the second amplifier.

In some embodiments, a method of measuring a gain of an amplifier comprises a measurement mode and a calibration mode. In the measurement mode, an output of the amplifier is connected to a node of a gain measurement circuit, and a first gain is determined based on voltages at a first node and a second node of the gain measurement circuit. In the calibration mode, the output of the amplifier is disconnected from the node of the gain measurement circuit, a reference voltage is applied to the node of the gain measurement circuit, and a second gain is determined based on voltages at the first node and the second node of the gain measurement circuit. The gain of the amplifier is determined based on the first gain and the second gain.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for measuring a gain of an amplifier, the circuit comprising:
   a switch;
   a first node coupled to an output of the amplifier through the switch when the switch has a first setting, and to a reference node through the switch when the switch has a second setting;
   a first circuit coupled to an input of the amplifier and the output of the amplifier; and
   a second circuit having an input coupled to an output of the first circuit and an output coupled to a second node, wherein
   the first circuit is configured to cause a first gain drop in a gain measurable between the first node and the second node, and
   the second circuit is configured to cause a second gain drop in the gain measurable between the first node and the second node.

2. The circuit of claim 1, further comprising:
   a buffer coupled between the output of the amplifier and the first node.

3. The circuit of claim 1, wherein
   the first circuit comprises an attenuating circuit, and
   the second circuit comprises a gain stage.

4. The circuit of claim 1, further comprising:
   a controller coupled to the first node and the second node, the controller configured to
     measure the gain between the first node and the second node, and
     determine the gain of the amplifier by adding the first gain drop and the second gain drop to the measured gain.

5. The circuit of claim 1, wherein the switch is configured to:
   in a measurement mode, couple the output of the amplifier to the first node, and isolate the first node from the reference node having a reference voltage, and
   in a calibration mode, isolate the output of the amplifier from the first node, and couple the first node to the reference node.

6. The circuit of claim 5, further comprising:
   a controller coupled to the first node and the second node, the controller configured to
     measure a first gain between the first node and the second node in the measurement mode,
     measure a second gain between the first node and the second node in the calibration mode, and
     add the first and second gain drops to, and subtract the second gain from, the first gain to determine the gain of the amplifier.

7. A gain measurement circuit, comprising:
   a first amplifier having a gain to be measured, the first amplifier having a first input, a second input, and an output coupled to a first node;
   a second amplifier having a first input coupled to the output of the first amplifier, a second input, and an output;
   a switch coupled between the output of the first amplifier and the first input of the second amplifier;
   a gain stage having an input coupled to the output of the second amplifier, and an output coupled to a second node;

a first resistor coupled between the first input and the second input of the first amplifier; and a second resistor coupled between the second input of the first amplifier and the output of the second amplifier, wherein the switch is configured to, responsive to a control signal, disconnect the output of the first amplifier from the first input of the second amplifier.

8. The gain measurement circuit of claim 7, further comprising:
a buffer having an input coupled to the first input of the second amplifier, and an output coupled to the first node.

9. The gain measurement circuit of claim 8, wherein the buffer comprises a uni-gain buffer.

10. The gain measurement circuit of claim 7, wherein the second resistor has a resistance greater than that of the first resistor.

11. The gain measurement circuit of claim 7, further comprising:
a third resistor coupled between the second input of the second amplifier and the output of the second amplifier; and
a fourth resistor coupled between the second input of the second amplifier and a reference node,
wherein the third resistor has a resistance equal to that of the fourth resistor.

12. The gain measurement circuit of claim 11, wherein the gain stage comprises:
a third amplifier having a first input defining the input of the gain stage, a second input, and an output defining the output of the gain stage;
a fifth resistor coupled between the second input of the third amplifier and the output of the third amplifier; and
a sixth resistor coupled between the second input of the third amplifier and a further reference node,
wherein the fifth resistor has a resistance greater than that of the sixth resistor.

13. The gain measurement circuit of claim 7, further comprising:
a controller coupled to the first node and the second node, the controller configured to determine the gain of the first amplifier based on voltages at the first node and the second node,
wherein the controller, the first amplifier, the second amplifier and the gain stage are incorporated in the same chip.

14. The gain measurement circuit of claim 7, wherein the switch is configured to
in a measurement mode, connect the output of the first amplifier to the first input of the second amplifier, and disconnect the first input of the second amplifier from a reference node, and
in a calibration mode, disconnect the output of the first amplifier from the first input of the second amplifier, and connect the first input of the second amplifier to the reference node.

15. The gain measurement circuit of claim 14, further comprising:
a controller coupled to the first node and the second node, the controller configured to
determine a first gain based on voltages at the first node and the second node during the measurement mode,
determine a second gain based on voltages at the first node and the second node during the calibration mode, and
determine the gain of the first amplifier based on the first gain and the second gain.

16. A method of measuring a gain of an amplifier, the method comprising:
in a measurement mode,
connecting an output of the amplifier to a node of a gain measurement circuit, and
determining a first gain based on voltages at a first node and a second node of the gain measurement circuit;
in a calibration mode,
disconnecting the output of the amplifier from the node of the gain measurement circuit,
applying a reference voltage to the node of the gain measurement circuit, and
determining a second gain based on voltages at the first node and the second node of the gain measurement circuit; and
determining the gain of the amplifier based on the first gain and the second gain.

17. The method of claim 16, wherein said determining the gain of the amplifier comprises cancelling the second gain from the first gain.

18. The method of claim 16, wherein said determining the gain of the amplifier comprises adding first and second gain drops to, and subtracting the second gain from, the first gain, wherein
the first gain drop is caused by an attenuating circuit of the gain measurement circuit, the attenuating circuit having an input coupled to said node, and
the second gain drop is caused by a gain stage of the gain measurement circuit, the gain stage having an input coupled to an output of the attenuating circuit, and an output coupled to the second node.

19. The method of claim 16, wherein said determining the first gain, said determining the second gain, and said determining the gain of the amplifier are performed by a controller incorporated on the same chip as the amplifier and the gain measurement circuit.

20. The method of claim 16, further comprising:
causing a prober to contact the first node and the second node to measure the voltages at the first node and the second node in the measurement mode and the calibration mode; and
blocking noises from being introduced from the prober to said node, said blocking performed by a buffer coupled between the first node and said node.

* * * * *